United States Patent [19]

Tigelaar et al.

[11] Patent Number: 4,713,677

[45] Date of Patent: Dec. 15, 1987

[54] ELECTRICALLY ERASABLE PROGRAMMABLE READ ONLY MEMORY CELL INCLUDING TRENCH CAPACITOR

[75] Inventors: Howard L. Tigelaar, Allen; Bert R. Riemenschnschneider, Murphy; James L. Paterson, Richardson, all of Tex.

[73] Assignee: Texas Instruments Incorporated, Dallas, Tex.

[21] Appl. No.: 914,517

[22] Filed: Oct. 2, 1986

Related U.S. Application Data

[63] Continuation of Ser. No. 707,008, Feb. 28, 1985, abandoned.

[51] Int. Cl.[4] .................... H01L 29/78; H01L 27/02; H01L 29/34
[52] U.S. Cl. ........................... 357/23.5; 357/41; 357/51; 357/54; 357/59; 357/55; 357/91; 365/185
[58] Field of Search .................... 357/23.5, 41, 51, 54, 357/55, 59, 91; 365/185

[56] References Cited

U.S. PATENT DOCUMENTS

| | | | |
|---|---|---|---|
| 4,004,159 | 1/1977 | Rai et al. ........................ | 357/23.5 |
| 4,169,291 | 9/1979 | Rössler ........................... | 357/23.5 |
| 4,222,062 | 9/1980 | Trotter et al. ................... | 357/23.5 |
| 4,542,396 | 9/1985 | Schuttan et al. ................ | 357/23.5 |
| 4,590,504 | 5/1986 | Guterman ....................... | 357/59 |

FOREIGN PATENT DOCUMENTS

59-61188  4/1984  Japan ................ 357/23.5

OTHER PUBLICATIONS

Y. L. Tsang, "Buried-Gate Electrically Alterable Memory Device", *IBM Technical Disclosure Bulletine*, vol. 24, (1981), pp. 1331-1333.

*Primary Examiner*—J. Carroll
*Attorney, Agent, or Firm*—Douglas A. Sorensen; Leo N. Heiting; Melvin Sharp

[57] ABSTRACT

An EEPROM cell is described which includes a trench formed in the field oxide adjacent to the EEPROM cell. Both the control gate and the floating gate of the cell are formed over this trench. By forming both gates above the trench, the capacitive coupling between the gates is increased. Thus a EEPROM cell constructed in accordance with the teachings of this invention may be constructed using a smaller surface area of the integrated circuit or may utilize a smaller programming voltage to charge and discharge the floating gate.

6 Claims, 12 Drawing Figures

ELECTRICALLY ERASABLE PROGRAMMABLE READ ONLY MEMORY CELL INCLUDING TRENCH CAPACITOR

This application is a continuation of application Ser. No. 707,008, filed Feb. 28, 1985, abandoned.

FIELD OF THE INVENTION

The present invention relates to the field of integrated circuit fabrication. More specifically, the present invention relates to the field of electrically erasable programmable read only memory (EEPROM) cell design.

BACKGROUND OF THE INVENTION

EEPROM's are memory devices which use floating gate metal oxide semiconductor technology to store data. Each EEPROM cell contains a floating gate MOS transistor. One logical state is written into the EEPROM cell by providing a required voltage between the source, gate and drain of the floating gate MOS transistor in order to cause tunneling of electrons from the substrate through the floating-gate insulator onto the floating gate. This charge may be stored in the floating gate for a number of years. The other logical state is written by providing specific voltages between the source, gate and drain which discharge electrons from the floating gate of the EEPROM cell by tunneling electrons through the floating gate insulator layer from the floating gate to the substrate.

FIG. 1 is a schematic diagram of a typical EEPROM cell. When memory cell 10 is addressed for reading, a positive voltage is applied to wordline 5 which causes transistors 4 and 11 to turn on. If electrons are stored on the floating gate of floating-gate transistor 12, these stored electrons raise the threshold voltage of transistor 12 above the voltage provided on row line 3. Therefore, memory cell 10 provides a high impendance between column line 7 and column line 8. Therefore, the column decoder (not shown) of the memory including memory cell 10 detects a high impedance between column leads 7 and 8 and provides an appropriate data output signal.

If no electrons are stored on the floating gate of floating gate transistor 12, the high-voltage signal provided on column line 3 causes floating gate transistor 12 to turn on. Therefore, the column decoder (not shown) detects a low impedance between column lines 7 and 8 and provides an appropriate data output signal. Transistor 13 and tunneling region 14 allow a specific tunneling voltage to be placed below the floating gate of floating gate transistor 12 which is independent of the substrate voltage.

FIG. 2 is a plan view of memory cell 10. Moat regions 22 provide the sources and drains for floating gate transistor 12, pass transistor 13 and pass transistor 11. Floating gate transistor 12 is programmed by charging floating gate 25 through the tunneling oxide in tunnel region 14. Finally, column lines 7 and 8 are connected to contacts 21 and 26 respectively. Lead 9 is provided by the extension of moat region 22 to vertically (relative to the page) adjacent cells.

FIG. 3 is a schematic side view of cut away AA of FIG. 2. Word line/gate 24 is insulated from substrate 35 by gate oxide regions 34, thus forming channel regions between moat regions 22 (FIG. 2). FIG. 4 is a schematic side-view diagram of floating gate field effect transistor 12 and tunneling region 14 which is cut away at point BB in FIG. 2. In addition to the components discussed with regard to FIGS. 2 and 3, FIG. 4 depicts inter-level oxide layer 36 and tunnel-oxide layer 37. Tunnel oxide layer 37 is approximately 100 angstroms thick and is designed to facilitate tunneling of electrons from N-type region 52 to floating gate 25.

FIGS. 5 and 6 are sideview schematic diagrams depicting cut aways CC and DD of FIG. 2.

The amount of charge tunneled to floating gate 25 is dependent upon the voltage developed across tunnel oxide 37. The voltage across tunnel oxide 37 can be determined using the laws of capacitive coupling to be described by the equation $$C_0V_0 = C_{10}V_1 + C_{20}V_2 + C_{30}V_3 + C_{40}V_4 + Q_0 \tag{1}$$

where,
- $C_0$ equals $C_{10} + C_{20} + C_{30} + C_{40}$,
- $V_0$ is the voltage on floating gate 25,
- $C_{10}$ is the capacitance between the floating gate 25 and substrate 35 across gate oxide 34,
- $V_1$ is the voltge on substrate 35,
- $C_{20}$ is the capacitance between floating gate 25 and N-type region 52 across tunnel oxide 37,
- $V_2$ is the potential on N-type diffusion 52,
- $C_{30}$ is the capacitive coupling between control gate 23 and floating gate 25,
- $V_3$ is the potential of control gate 23,
- $C_{40}$ is the capacitance between floating gate 25 and the substrate across field oxide regions 31, 32 and 33,
- $V_4$ is the potential of substrate 35, and
- $Q_0$ is equal to the net electrical charge on the floating gate.

Under typical operating conditions, V1 and V4 are approximately zero volts, thus equation 1 becomes, $$C_0V_0 = Q_0 + C_{20}V_2 + C_{30}V_3 \tag{2}$$

During the charging operation(i.e., creating a net negative charge on floating gate 25), V3 is typically 15V and V2 is typically 0V, thus equation 2 becomes, $$V_0 = (Q_0 + C_{30}V_3)/C_0 \tag{3}$$

Because C10 and C40 are small relative to C20 and C30, the voltage drop across tunnel oxide 37 (V0 minus V2, V2 equal to zero) is proportional to C30/ (C20+C30) with an additive factor of Q0.

During the discharging operation (i.e. creating a net positive or net zero charge), V2 is typically 15V and V3 is typically 0V and equation 2 becomes, $$V_0 = (Q_0 + C_{20}V_2)/C_0 \tag{4}$$

The discharging voltage V2—V0, which is, $$V_2 - V_0 = ((C_0 - C_{20})V_2 - Q)/C_0 = ((C_{10} + C_{30} + C_{40})V_2 - Q)/C_0 \tag{5}$$

Because C10 and C40 are small relative to C20 and C30, V2−V0 is proportional to C30/ (C20+C30) with an additive factor of Q0.

As can be seen from equations 3 and 5, the tunneling voltage increases as C30 increases. This capacitance is limited by the area of overlap between word line 23 and floating gate 25 in the prior art. Therefore, it is an object of the present invention to provide a structure whereby the capacitive coupling between the word line and the floating gate in a EEPROM memory cell may be increased without increasing the surface area of the EPROM cell.

SUMMARY OF THE INVENTION

One embodiment of the present invention provides a structure for an EEPROM which includes a trench capacitor formed in an adjacent field oxide region. The trench structure increases the capacitive coupling between the word line of the EEPROM cell and the floating gate of the EEPROM cell. Thus an EEPROM cell constructed in accordance with the teachings of this invention may be constructed using a smaller surface area of the integrated circuit or may utilize a smaller programming voltage to charge and discharge the floating gate.

DETAILED DESCRIPTION

Figure 7:
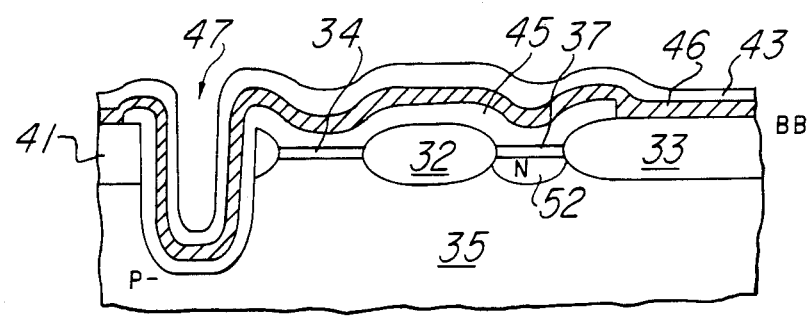
FIG. 7 is a schematic side view of one embodiment of the present invention.

FIG. 7 is a schematic side view of one embodiment of the present invention. FIG. 7 is a cut away of Section BB of an EEPROM cell such as EEPROM cell 10 of FIG. 4 further including an improvement of this invention. Components having the same label in FIG. 7 as those of FIG. 4 perform the same function as the corresponding components in FIG. 4. The structure of FIG. 7 includes a trench through field oxide region 41 which provides greater capacitive coupling between word line 43 and floating gate 45 than the capacitive coupling between word line 23 and floating gate 25 of FIG. 4 by increasing the interface area between word line 43 and floating gate 45. The structure of FIG. 7 requires no surface area increase beyond the surface area used in the structure of FIG. 4 but provides greater capacitive coupling, thereby allowing a lower programming voltage to be utilized to charge and discharge floating gate 45. Alternatively, the structure of FIG. 7 could be made smaller than the structure of FIG. 4 and still provide adequate capacitive coupling between word line 43 and floating gate 45 so that a sufficient tunneling voltage may be generated across tunnel oxide layer 37 using voltage levels equal to those used to charge the cell of FIG. 5.

Figure 8:
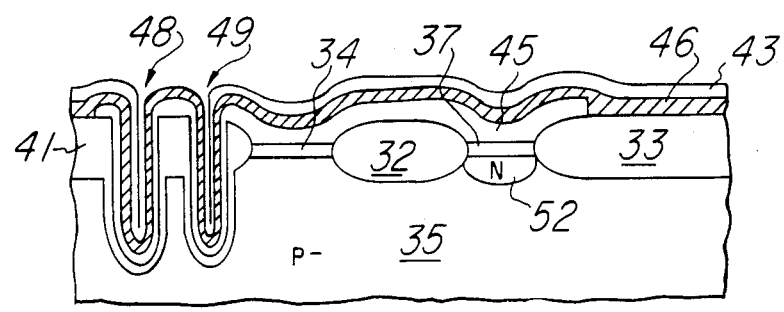
FIG. 8 is a schematic side view of a second embodiment of the present invention.

Another embodiment of the present invention is depicted in the schematic side view of FIG. 8. The structure of FIG. 8 includes narrow trench regions 48 and 49 rather than the wide trench region 47 shown in FIG. 7. Narrow trench regions 48 and 49 provide an additional benefit in that when word line 43 is deposited on the surface of the structure of FIG. 8. The deposited polycrystalline silicon forms together to planarize the surface of the structure of FIG. 8. Thereby providing the benefit of increased capacitance and a planarized surface.

Figure 9A:
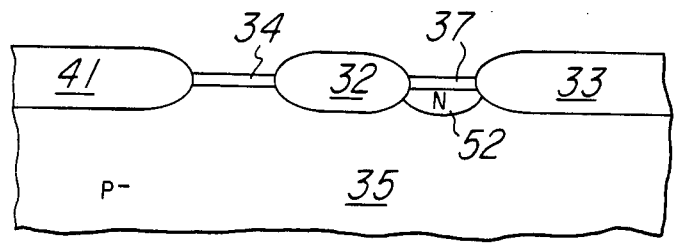
FIGS. 9A-9D are schematic side views illustrating the processing steps necessary to fabricate the embodiment of the present invention shown in FIG. 7.
Figure 9B:
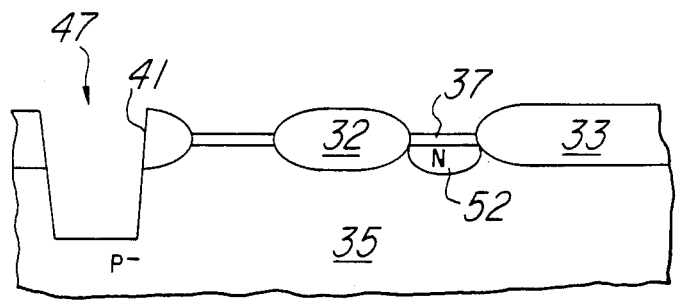

FIG. 9A is a schematic side view showing one stage of the processing steps necessary to fabricate one embodiment of the present invention. Field oxide regions 32, 33, and 41, gate oxide layer 34, N-type region 52 and tunnel oxide 37 are formed in substrate 35 using techniques well known in the art. Field oxide region 41 is patterned and anisotropically etched to provide trench 47 as shown in FIG. 9B. Other etching processes may be used to etch trench 47; however, anisotropic etching provides vertical sidewalls to trench 47 which maximize the capacitance per unit plan view area.

Figure 9C:
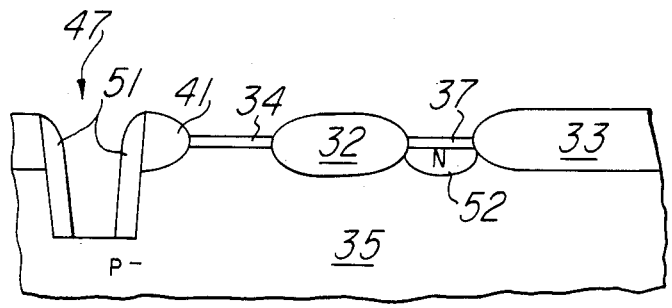
Figure 9D:
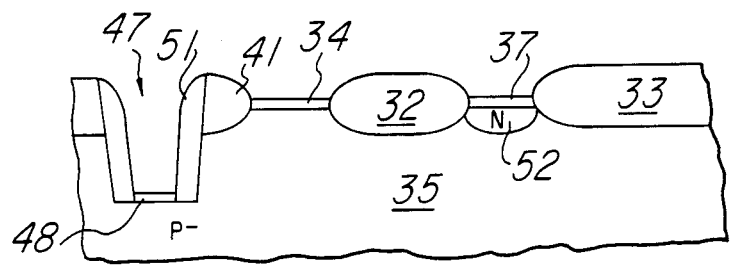

In an alternative process, trench 47 may be formed so that it does not completely go through field oxide region 41. However, in that embodiment, it is difficult to be certain that none of the field oxide regions in an EEPROM constructed in accordance with the teachings of this invention are completely etched through. If this were the case, when floating gate 45 was deposited in trench 47 floating gate 45 would be shorted to substrate 35 and the EEPROM cell would be inoperable. To avoid this problem trench 47 is etched through field oxide region 41 and oxide is reformed in trench 47. A layer of silicon dioxide(not shown) is formed on the surface of the structure of FIG. 9B by low pressure chemical vapor deposition and this silicon dioxide layer is anisotropically etched to leave silicon dioxide filaments 51 of FIG. 9C. Silicon dioxide layer 41 is then formed during the oxidation step used to form gate oxide layer 34 using techniques well known in the art. The result is shown in FIG. 9D.

Figure 1:
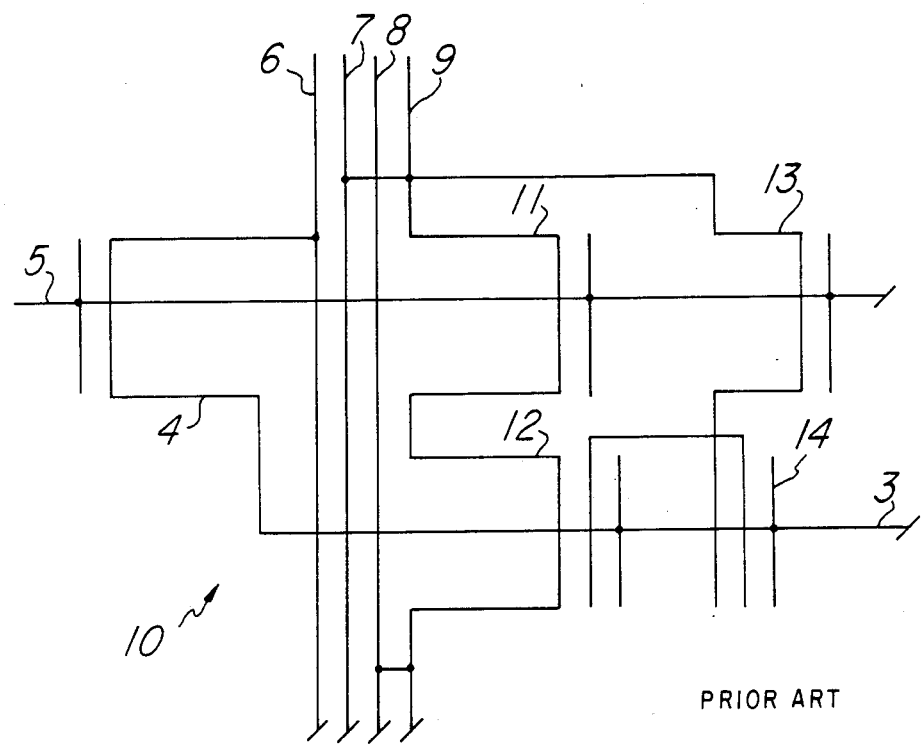
FIG. 1 is a schematic diagram of a EEPROM memory cell.
Figure 2:
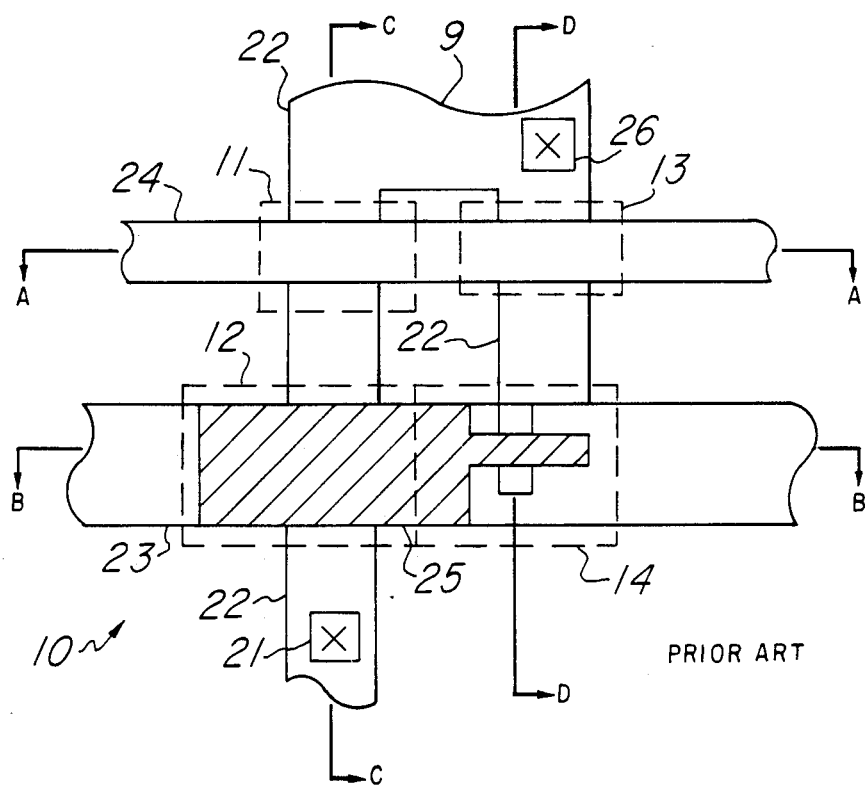
FIG. 2 is a plan view of EEPROM cell 10.
Figure 3:
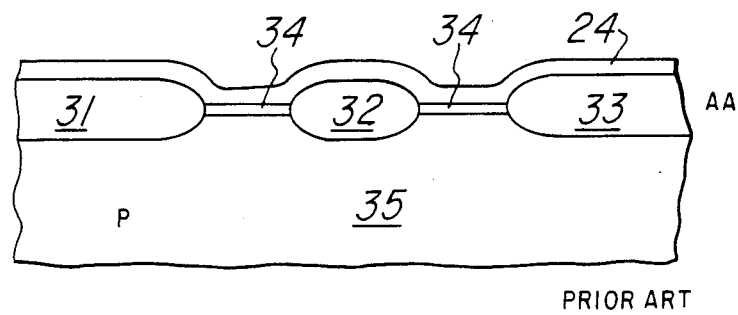
FIG. 3 is a cut away of section AA of EEPROM cell 10.
Figure 4:
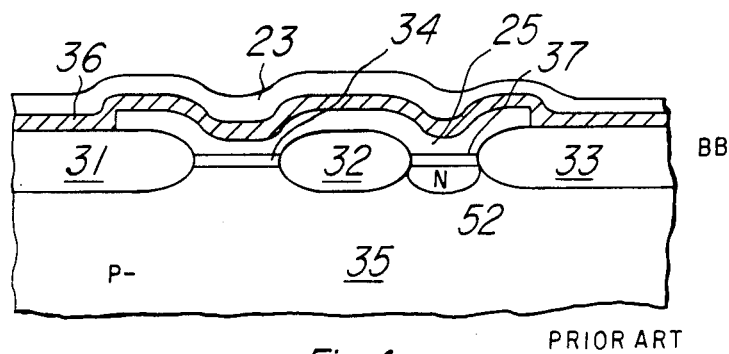
FIG. 4 is a cut away of section BB of EEPROM cell 10.
Figure 5:
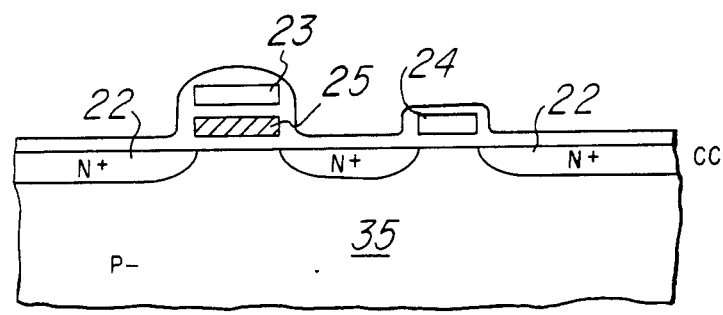
FIG. 5 is a cut away of section CC of EEPROM cell 10.
Figure 6:
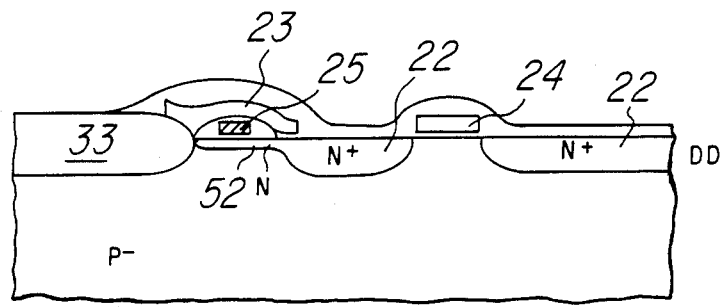
FIG. 6 is a cut away of section DD of EEPROM cell 10.

A layer of polycrystalline silicon is then deposited to a thickness of approximately 3,000 angstroms by low pressure chemical vapor deposition. A layer of oxide is then formed above the polycrystalline silicon layer to a thickness of approximately 250 angstroms using low pressure chemical vapor deposition. A silicon nitride layer is then deposited on the surface of this silicon dioxide layer to a thickness of approximately 250 angstroms using low pressure chemical vapor deposition. The nitride layer, silicon dioxide layer, and polycrystalline silicon layer are then etched to form floating gate 45 and inter-level insulator layer 46 of FIG. 7. A second polycrystalline silicon layer approximately 4,500 angstroms thick is then deposited by low pressure chemical vapor deposition. Techniques well known in the art are used to completely insulate this second layer of polycrystalline silicon from the first polycrystalline silicon layer. These polycrystalline silicon layers are patterned and etched using techniques well known in the art to provide word line 43 and word line 24 (FIG. 4). The result of these processing steps and several others which are apparent but not shown provides the structure shown in FIG. 7.

Although the specification describes specific embodiments of the present invention, it is not to be construed as limiting the scope of the invention. Other embodiments of the present invention will become evident to those skilled in the art in light of the teachings of this specification.

TECHNICAL ADVANTAGES

An EEPROM cell constructed in accordance with the teachings of this invention provides increased capacitance between the control gate and the floating gate of the EEPROM cell without increasing the surface area of the EEPROM cell. This allows a lower programming voltage to be used to program the EEPROM cell or alternatively allows a smaller EEPROM cell to be designed using the same programming voltage.

We claim:

1. An electrically erasable programmable read only memory cell which may be programmed using a reduced voltage level comprising:
   (a) a substrate having moat regions formed therein, said moat regions having a gate oxide layer formed on the surface of said moat regions;
   (b) field oxide regions disposed between said moat regions formed in said substrate, one of said field oxide regions containing at least one trench, each trench having a bottom and side walls formed of a first oxide layer;
   (c) a floating gate disposed on the surface of said gate oxide layer, one of said field oxide regions and said first oxide layer;
   (d) an insulating layer disposed over said floating gate; and
   (e) an electrically conductive line disposed above and insulated from said floating gate by said insulating layer and serving as a word line for said memory, said conductive line having a substantially planar upper exposed surface over said trench.

2. A structure as in claim 1 wherein said gate oxide layer includes a tunneling oxide disposed between said floating gate and at least one of said moat regions, said field oxide containing a second trench having a bottom and side walls formed of a second oxide layer, said floating gate also on said second oxide layer, and said conductive line having a substantially planar upper exposed surface over said trench.

3. An electrically erasable programmable read only memory cell which may be programmed using a reduced voltage level, wherein each cell of said memory comprises:
   (a) a substrate having most regions formed therein, said moat regions having a gate oxide layer formed on the surface of said moat regions;
   (b) field oxide regions disposed between said moat regions formed in said substrate, one of said field oxide regions containing at least one trench, each trench having a bottom and side walls formed of a first oxide layer;
   (c) a floating gate disposed on the surface of said gate oxide layer, one of said field oxide regions and said first oxide layer;
   (d) an insulating layer disposed over said floating gate;
   (e) an electrically conductive line disposed above and insulated from said floating gate by said insulating layer and serving as a word line for said memory, said conductive line having a substantially planar upper exposed surface over said trench; and
   (f) column lines connected to selected ones of said moat regions of each of said memory cells.

4. A structure as in claim 3 wherein said gate oxide layer includes a tunneling oxide disposed between said floating gate and at least one of said moat regions, said field oxide containing a second trench having a bottom and side walls formed of a second oxide layer, said floating gate also on said second oxide layer, and said conductive line having a substantially planar upper exposed surface over said trench.

5. A structure as in claim 1 wherein said gate oxide layer includes a tunneling oxide disposed between said floating gate and at least one of said moat regions.

6. A structure as in claim 3 wherein said gate oxide layer includes a tunneling oxide disposed between said floating gate and at least one of said moat regions.

* * * * *